United States Patent [19]

Mehra et al.

[11] Patent Number: 4,966,831
[45] Date of Patent: Oct. 30, 1990

[54] LENS ARRAYS FOR LIGHT SENSITIVE DEVICES

[75] Inventors: Madhav Mehra; Armin K. Weiss, both of Rochester, N.Y.

[73] Assignee: Eastman Kodak Company, Rochester, N.Y.

[21] Appl. No.: 341,083

[22] Filed: Apr. 20, 1989

[51] Int. Cl.[5] ................................................. G03C 5/00
[52] U.S. Cl. ..................................... 430/321; 430/324; 430/330
[58] Field of Search ...................... 430/7, 321, 330, 324

[56] References Cited

U.S. PATENT DOCUMENTS

| | | | |
|---|---|---|---|
| 4,684,599 | 8/1987 | DoMinh et al. | 430/270 |
| 4,694,185 | 9/1987 | Weiss | 250/578 |
| 4,721,999 | 1/1988 | Takemura et al. | 358/44 |

Primary Examiner—Jose Dees
Attorney, Agent, or Firm—Raymond L. Owens

[57] ABSTRACT

In the method of this invention, lens arrays for light sensitive devices are made which have lenses that are substantially transparent over the wavelength range from 400 nm to 1000 nm comprising the steps of:

(a) providing a spacer and planarization layer on the device over each sensing element;
(b) applying a layer of photoresist material;
(c) patterning and flowing the photoresist material to form a desired lens array on the spacer and planarization layer by applying heat; and
(d) conformally coating the so formed lenses with a layer of between 1000–3000 Å of a transparent dielectric material such as silicon dioxide.

5 Claims, 4 Drawing Sheets

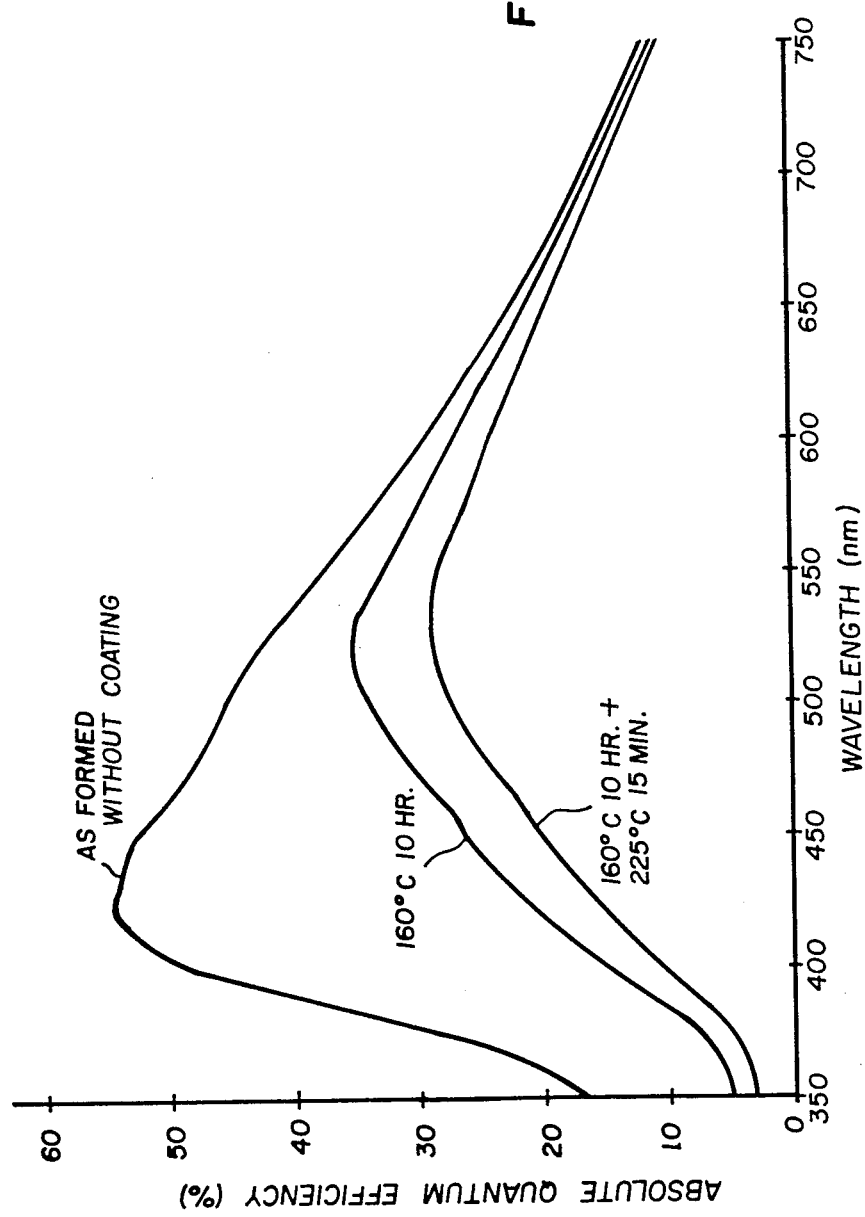

LENS ARRAYS FOR LIGHT SENSITIVE DEVICES

CROSS REFERENCE TO RELATED APPLICATION

Reference is made to commonly assigned U.S. patent application Ser. No. 146,632 filed Jan. 21, 1988 U.S. Pat No. 4,865,950 entitled "Laminate for the Formation of Beam Roads for IC Chip Bonding Featuring Improved Positive Working Resist " to DoMinh.

FIELD OF THE INVENTION

The present invention relates to making stable lens arrays for light sensitive devices.

BACKGROUND OF THE INVENTION

Image sensing devices made up of an array of laterally spaced sensors are well known and can take a variety of forms. The array can be viewed as being made up of a number of laterally offset regions, commonly referred to as pixels or sensing elements. The art has recognized that sensing advantages can be realized by forming a lens array having a convex lens surface for each pixel.

A lenticular array placed in registration with the device serves to focus the incident light upon the photodiodes. This has the effect of increasing the light gathering area of the photodiode and hence improving the signal.

The device has a lens supporting layer for directing light inwardly to a semiconductive light sensor. The fabrication of lenticular arrays is based upon using typical positive-working photoresists. A coating of the photoresist is exposed and developed to produce an array of resist "islands". The resist pattern is then flood exposed to bleach the remaining photochemistry and subsequently heated until the resist material flows enough to form a lens and yet not so much as to cause adjacent lenses to flow together. There are, however, several disadvantages to the use of conventional positive-working photoresists. The final resists absorb slightly in the blue portion of the spectrum and the absorption increases when the lenses are heated in air. The result of the increased absorption is a lower signal than could be obtained with more transparent lenses. To minimize this discoloration, the lenses are formed in a non-oxidizing atmosphere, such as nitrogen. The lens formation occurs in 10–60 seconds at a temperature of the resist below 180° C. However, the desired packaging procedures of the finished devices typically require thermal treatment steps of up to 90 minutes at 150° C. and about 60 seconds at 215° C. Self-absorption of such lenses is further exaggerated by this temperature application over a period causing a yellowing or browning, see FIG. 4A. The use of these resists, therefore, necessitates a radically altered packaging process, with attendant complexities and disadvantages.

SUMMARY OF THE INVENTION

It is an object of this invention to produce lens arrays for light sensitive devices which eliminate the problems noted above.

This object is achieved in a method of forming on a light sensitive device defining a plurality of sensing elements, an integral lens array having a separate lens for each sensing element which is transparent in the visible spectrum, comprising the steps of:

(a) providing a spacer and planarization layer on the device over each sensing element;
(b) applying a layer of photoresist material;
(c) patterning and flowing the photoresist material in the shape of the desired lens array on the spacer and planarization layer; and
(d) conformally coating the so formed lens array with a transparent material such as silicon dioxide.

An advantage of this invention is that the preferred packaging procedures for devices with lensed arrays may be performed at atmospheric conditions.

A further advantage of this invention is the retention of the lens shape when heating the lens array at a temperature above 150° C. for an extended period of time.

The applied conformal coating provides protection against discoloration upon heating at, for example, 160° C. for 10 hours (see FIG. 4B) or 100° C. for 1000 hours.

With certain lens materials, the conformal coating protects against reflowing of the lenses at temperatures greater than the original heat-forming temperature.

Applicants have discovered that a conformal silicon dioxide over-coating gives the lenses extensive temperature stability thereby eliminating the reduction in transmission of blue light. In addition, the oxide shell is a relatively hard, scratch resistant material that conformally encapsulates the organic photoresist material. This encapsulation results in a hard shell that stabilizes the lenses against reflow of the photoresist material, while also providing an abrasion protection for the organic lenses. As a result, an improved lenticular array is formed that provides and retains improved signal levels in the blue portion of the visible spectrum where many other devices are deficient in response.

BRIEF DESCRIPTION OF THE DRAWINGS

The invention can be better appreciated by reference to the following description of preferred embodiment considered in conjunction with the drawings, in which

FIGS. 4A and 4B show a comparison of lenses without and with the coating of FIG. 3.

MODE OF CARRYING OUT THE INVENTION

Figure 1:
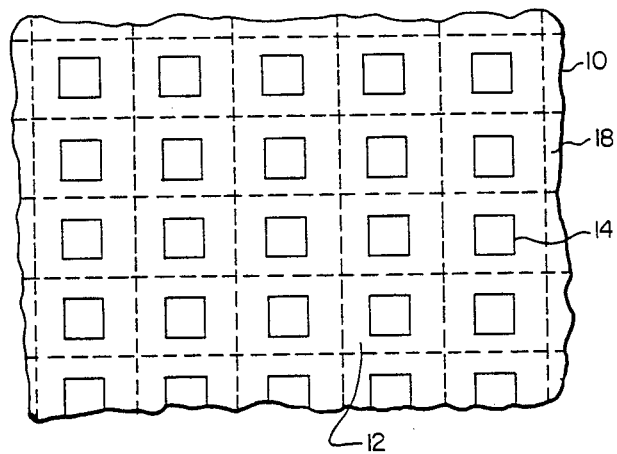
FIG. 1 is a plan view of a multipixel semiconductor array.

In FIG. 1 a multipixel semiconductor array 10 is shown formed by a plurality of laterally spaced photodiodes 14 on a substrate.

The semiconductor array can be viewed as being made up of a plurality of sensing elements or pixels 12, each having a photodiode sensor 14 centrally positioned adjacent its upper surface and each peripherally defined by linear polygonal boundaries indicated by dashed lines 18.

Figure 2:
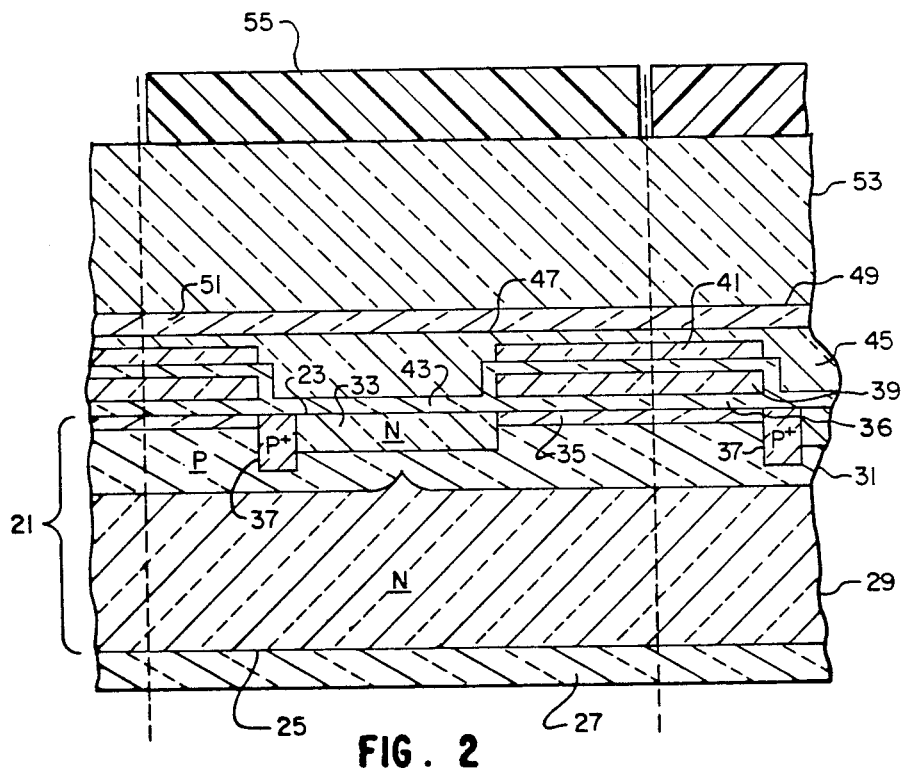
FIG. 2 is a sectional view of a single sensing element just after a photoresist layer has been patterned in the process of forming the lens array of FIG. 3.

Turning now to FIG. 2 where we see in cross-section a sensing element or pixel 12 of the array of FIG. 1 while in the process of forming the lens array of this invention. A semiconductive substrate 21, typically a monocrystalline silicon substrate, is shown having an upper major surface 23 and a lower major surface 25. A conductive layer 27 covers the lower major surface. The semiconductive substrate has an N conductivity type region 29 and a P conductivity type well 31 formed by diffusion from the upper major surface 23. A photodiode is formed centrally in the pixel by an N diffusion 33 from the upper major surface. The function of the photodiode is to produce electrons in proportion to the amount of light received on exposure.

The electrons are supplied to an adjacent charge coupled device. To create a buried channel for electron transfer, a shallow N conductivity type region 35 is located adjacent the upper major surface. The buried channel thus formed extends from the photodiode to an adjacent CCD. To prevent unwanted lateral charge conductions, P+ conductivity type zones 37, referred to as channel stops, isolate the photodiode and the adjacent CCD from other adjacent surface structures.

A gate electrode 39, typically formed of polycrystalline silicon, is shown overlying a gate insulator 36 which overlies the upper surface of the semiconductive substrate. Since polycrystalline silicon is transparent, a light shield 41, typically formed of aluminum, overlies the gate electrode. A transparent insulator 43 is shown overlying the entire upper major surface of the semiconductive substrate and also separating the gate electrodes from the light shields. Typically the insulator is silicon dioxide, with a surface laydown of passivant, such as borosilicate glass, being common. Although shown as unit, the insulator is typically formed in several successive fabrication steps. A transparent material 45, commonly referred to as a planarizing material, is positioned to provide a smooth surface 47. On this surface is positioned a filter 49 having an element 51, such as an additive primary color filter element, coextensive with the pixel or sensor element boundaries. A spacer and planarization layer 53 is formed on filter 49.

The purpose of layer 53 is to offset the lens from the photodiode to maximize collection of light in the photodiode or to permit the use of a smaller photodiode with the same collection efficiency. The layer 53, of course, has to be transparent.

A lens array is formed in photoresist layer 55 in the manner described in detail in U.S. Pat. No. 4,694,185. The photoresist could include material which has the following formula:

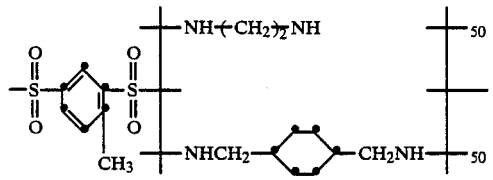

Commonly assigned U.S. Pat. No. 4,684,599 to DoMinh et al discloses positive-working photoresist compositions having polysulfonamides as a polymeric binder and a quinone sensitizer which provides alkali solubility to the composition when exposed to activating radiation.

A photosensitive polymer layer 55 is spin coated from an appropriate solvent onto the layer 53 which has been applied previously. The layer 55 is pattern wise exposed with light in the spectral range between 350 and 450 nm. This is followed by development in an aqueous base solution to remove the exposed areas. After development, the remaining resist is given a "flood" or non patterning exposure designed to destroy the remaining photochemistry, thus making the pattern transparent to light over the wavelength range from 400 nm to 1000 nm. Shaping the convex lenses is accomplished by heating the patterned resist layer 55 to a temperature below 160° C. for a time sufficient to allow the patterns to round and thus to produce lenses. This can be accomplished at ambient atmosphere conditions (air) or in an inert-gas atmosphere (nitrogen or argon).

Figure 3:
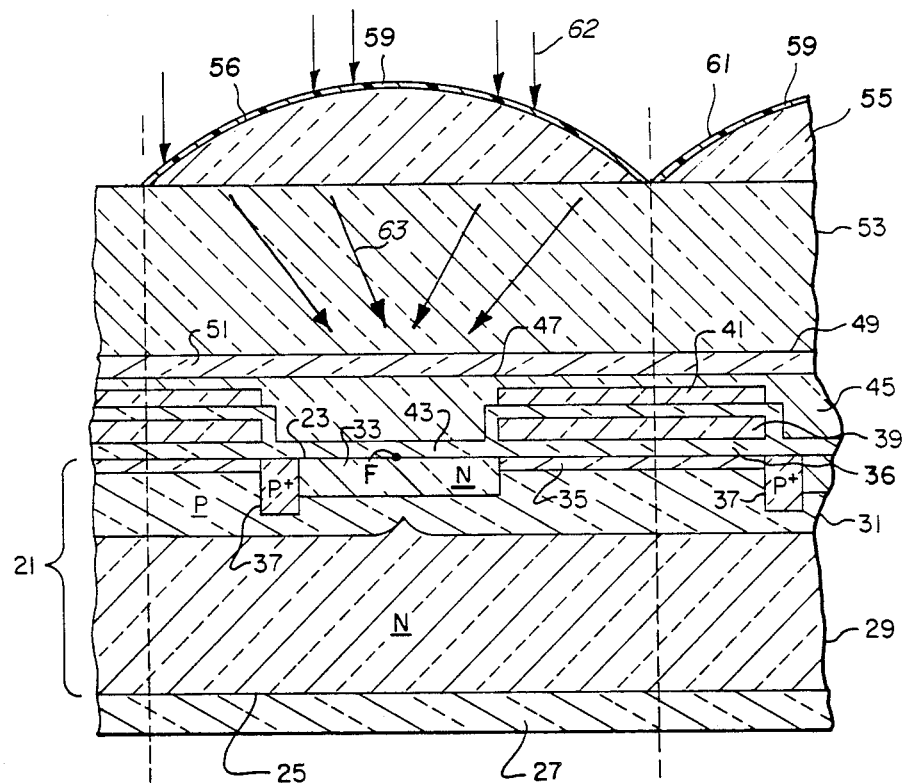
FIG. 3 is a sectional view of the sensing element of FIG. 2 after the lens array has been formed and coated with silicon dioxide.

The upper surface 56 of each lens is convex. For a more complete disclosure of flowing photoresist to form a lens array, see commonly assigned U.S. Pat. No. 4,694,185. Turning to FIG. 3, a conformal coating of silicon dioxide 59, having a thickness of between 1000 and 3000 Å, is then deposited onto each lens by a dry process such as sputtering. This coating may be an alternate transparent material such as, for example, silicon nitride, titanium dioxide or tantalum pentoxide. The top surface 61 of this coating is convex and conformal with the lens surface 56. The primary requirement is transparency. The deposition can be done in any manner that keeps the substrate temperature below that which would deform the lenses, and providing a conformal coating. E beam evaporation is an example of another process that can be used to form layer 59.

Light striking the surface 61, indicated by vertical arrows 62, is bent inwardly, as indicated by the converging arrows 63 in layer 53. The light is shown directed to the focal spot F on the surface of the photodiode.

It should be noted that the inward directing of light from the lens to the photodiode causes light to be received by only the central portion of the filter 51. Thus, the lens array constructions allows edge alignments of the pixel boundaries and the filter elements to be relaxed without incurring an optical penalty.

While only one sensing element of the exemplary semiconductor device is shown in FIG. 3, it will be appreciated that actual devices typically contain very large numbers of essentially similar sensing elements, actual numbers ranging in the $10^3$ to $10^6$ orders of magnitude, depending on the application being served. While the invention has been described in terms of directing light to a photodiode, it will be appreciated that many CCD's are constructed for directly sensing light and can be made in accordance with the invention. The application of the invention to still other light sensing multipixel semiconductor arrays will be readily appreciated.

An important feature of this invention (see FIG. 4B) is that by conformally coating the lenses, at least 90% of the optical transmittance will be retained in a range of 400 nm to 700 nm when heated at a temperature above 150° C. for at least 10 hours. The lenses, when so heated, will retain their shape.

EXAMPLE

Figure 4B:
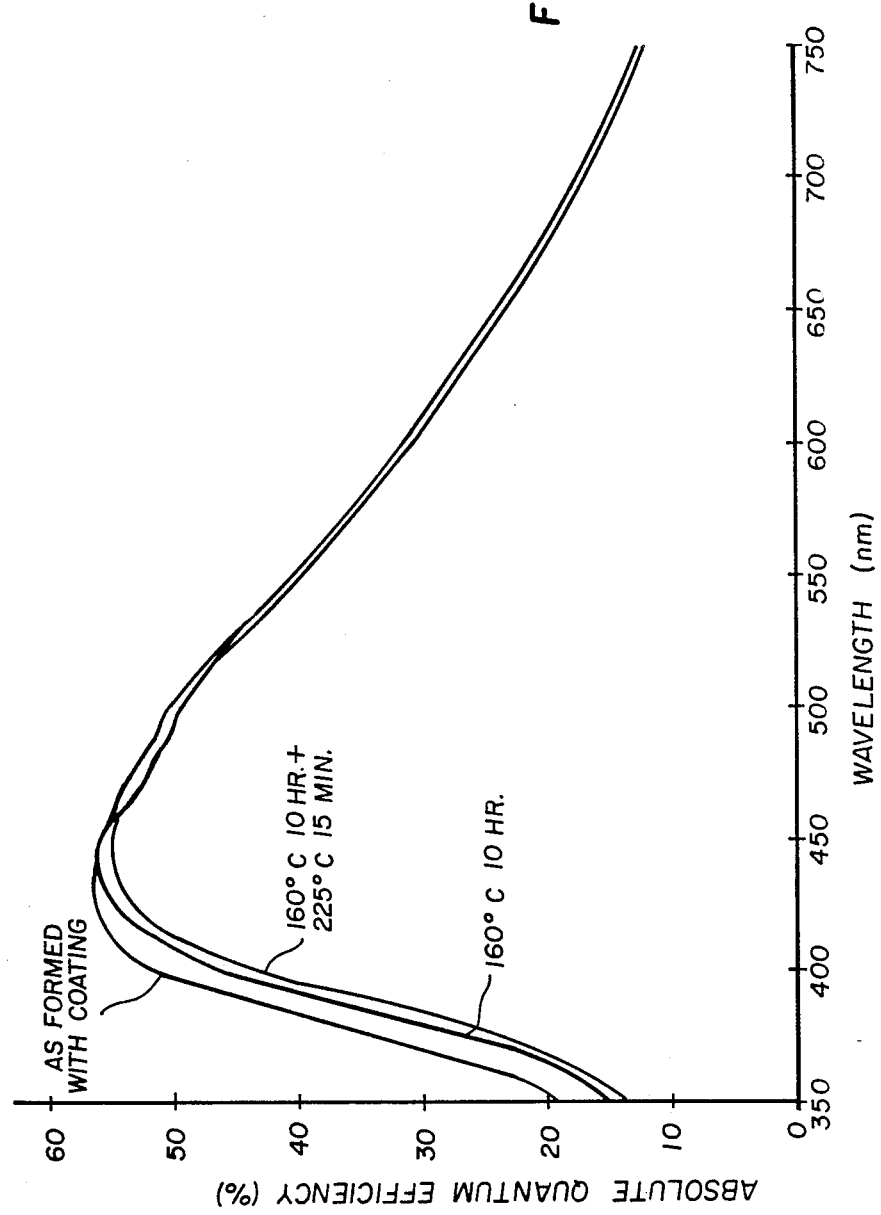

A lenticular array was formed on an interline CCD in the manner described in U.S. Pat. No. 4,694,185. This reflowed lenticular surface was then coated with 1000 Å of sputtered silicon dioxide. FIG. 4a and FIG. 4b show a comparison of lenses without and with the coating, respectively, and without color filter arrays. Both the control (FIG. 4a) and the experiment (FIG. 4b) were subjected to heat treatments at 160° C. for 10 hours in an air-recirculating oven. The spectral response is shown for both devices. Further heat treatment at 225° C. for an additional 15 minutes was also done and the spectral responses thereafter for both devices are also shown. The silicon dioxide coated lenses exhibit superior thermal stability. They also provide protection against abrasion.

The invention has been described in detail with particular reference to a preferred embodiment thereof, but it will be understood that variations and modifications can be effected within the spirit and scope of the invention.

What is claimed is:

1. In a method of forming an integral lens array on a light sensitive device defining a plurality of sensing elements, the lens array having a separate lens for each image sensing element, said lenses being substantially transparent over the wavelength range from 400 nm to 1000 nm comprising the steps of:
   (a) providing a spacer and planarization layer on the device over each sensing element;
   (b) applying a layer of photoresist material;
   (c) patterning and flowing the photoresist material to form a desired lens array on the spacer and planarization layer by applying heat; and
   (d) conformally coating the so formed lenses with a layer having a thickness of between 1000 and 3000 Å of transparent dielectric silicon dioxide.

2. The method of claim 1 wherein such lens-forming heating is applied in ambient atmosphere conditions.

3. The method of claim 1 wherein such lens-forming heating is applied in an inert-gas atmosphere.

4. The method of claim 1 wherein a lens array, coated conformally with said transparent dielectric silicon dioxide, retains at least 90% of its optical transmittance of light in the wavelength range from 400 nm to 700 nm upon heating at a temperature above 150° C. for at least 10 hours.

5. The method of claim 1 wherein such lens array coated conformally with said transparent dielectric silicon dioxide retains the shapes of its individual lenses upon heating at a temperature above 150° C. for at least 10 hours.

* * * * *